United States Patent
Micks et al.

(10) Patent No.: US 10,521,677 B2
(45) Date of Patent: Dec. 31, 2019

(54) VIRTUAL SENSOR-DATA-GENERATION SYSTEM AND METHOD SUPPORTING DEVELOPMENT OF VISION-BASED RAIN-DETECTION ALGORITHMS

(71) Applicant: Ford Global Technologies, LLC, Dearborn, MI (US)

(72) Inventors: Ashley Elizabeth Micks, Mountain View, CA (US); Harpreetsingh Banvait, Sunnyvale, CA (US); Jinesh J Jain, Palo Alto, CA (US); Vidya Nariyambut Murali, Sunnyvale, CA (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 589 days.

(21) Appl. No.: 15/210,670

(22) Filed: Jul. 14, 2016

(65) Prior Publication Data
US 2018/0018527 A1    Jan. 18, 2018

(51) Int. Cl.
*G06K 9/66* (2006.01)
*G06T 7/20* (2017.01)
(Continued)

(52) U.S. Cl.
CPC ..... *G06K 9/00805* (2013.01); *G06F 17/5009* (2013.01); *G06K 9/00335* (2013.01);
(Continued)

(58) Field of Classification Search
CPC ....... G06F 17/5009; G06T 2207/30256; G06T 2207/30192; G06T 7/20; G06K 9/6255;
(Continued)

(56) References Cited

U.S. PATENT DOCUMENTS

| 10,049,284 | B2 * | 8/2018 | Jain | G06K 9/00791 |
| 2008/0062167 | A1 * | 3/2008 | Boggs | G06F 17/5004 |
| | | | | 345/419 |

(Continued)

FOREIGN PATENT DOCUMENTS

| CN | 203275098 U | 11/2013 |
| KR | 20000013675 A | 3/2000 |

(Continued)

OTHER PUBLICATIONS

A Lane Departure Warning System Developed under a Virtual Environment; Ye Wang et al, 2014 International Conference on Informative and Cybernetics for Computational Social Systems (ICCSS), pp. 63-67 (Year: 2014).*

(Continued)

*Primary Examiner* — Aniss Chad
(74) *Attorney, Agent, or Firm* — David R. Stevens; Stevens Law Group (57) ABSTRACT

A method for generating training data is disclosed. The method may include executing a simulation process. The simulation process may include traversing a virtual camera through a virtual driving environment comprising at least one virtual precipitation condition and at least one virtual no precipitation condition. During the traversing, the virtual camera may be moved with respect to the virtual driving environment as dictated by a vehicle-motion model modeling motion of a vehicle driving through the virtual driving environment while carrying the virtual camera. Virtual sensor data characterizing the virtual driving environment in both virtual precipitation and virtual no precipitation conditions may be recorded. The virtual sensor data may correspond to what a real sensor would have output had it sensed the virtual driving environment in the real world.

18 Claims, 4 Drawing Sheets

(51) Int. Cl.
*G06F 17/50* (2006.01)
*G06K 9/00* (2006.01)
*G06K 9/62* (2006.01)
*H04N 5/247* (2006.01)

(52) U.S. Cl.
CPC .............. *G06K 9/6267* (2013.01); *G06K 9/66* (2013.01); *G06T 7/20* (2013.01); *H04N 5/247* (2013.01); *G06T 2207/30192* (2013.01); *G06T 2207/30256* (2013.01)

(58) Field of Classification Search
CPC ............. G06K 9/6267; G06K 9/00805; G06K 9/00335; G06K 9/66; H04N 5/247
See application file for complete search history.

(56) References Cited

U.S. PATENT DOCUMENTS

| | | | | |
|---|---|---|---|---|
| 2014/0181630 | A1* | 6/2014 | Monney | G06K 9/00201 715/232 |
| 2014/0277939 | A1* | 9/2014 | Ren | G01C 21/3638 701/36 |
| 2015/0015711 | A1* | 1/2015 | Ahiad | B60S 1/0844 348/148 |
| 2015/0097864 | A1* | 4/2015 | Alaniz | G06T 19/006 345/633 |
| 2015/0203107 | A1* | 7/2015 | Lippman | B60W 30/00 701/23 |
| 2015/0213592 | A1* | 7/2015 | Mochizuki | B60K 35/00 345/632 |
| 2015/0332099 | A1* | 11/2015 | Kosubek | B60S 1/0844 348/148 |
| 2015/0363654 | A1* | 12/2015 | Zhao | G06K 9/00805 382/104 |
| 2016/0210382 | A1* | 7/2016 | Alaniz | G05D 1/0221 |
| 2016/0314224 | A1* | 10/2016 | Wei | G05B 17/02 |
| 2017/0076019 | A1* | 3/2017 | Nallapa | G06F 17/5009 |
| 2017/0083794 | A1* | 3/2017 | Nallapa | G06K 9/6262 |
| 2017/0109458 | A1* | 4/2017 | Micks | G06F 3/0484 |
| 2017/0109928 | A1* | 4/2017 | Micks | G09B 9/00 |
| 2017/0177954 | A1* | 6/2017 | Micks | G06K 9/209 |
| 2017/0286570 | A1* | 10/2017 | Kim | G06F 17/5095 |
| 2017/0293808 | A1* | 10/2017 | Jain | G06K 9/00791 |
| 2017/0366647 | A1* | 12/2017 | Pepper | H04L 67/38 |
| 2018/0004210 | A1* | 1/2018 | Iagnemma | G05D 1/0212 |
| 2018/0011954 | A1* | 1/2018 | Micks | G06K 9/00798 |
| 2018/0018527 | A1* | 1/2018 | Micks | G06F 17/5009 |
| 2018/0099646 | A1* | 4/2018 | Karandikar | B60S 1/0844 |

FOREIGN PATENT DOCUMENTS

| | | |
|---|---|---|
| KR | 100709401 B1 | 4/2007 |
| KR | 20120064474 A | 6/2012 |
| KR | 101419170 B1 | 7/2014 |

OTHER PUBLICATIONS

Bossu, Jérémie & Hautière, Nicolas & Tarel, Jean-Philippe. (2011). Rain or Snow Detection in Image Sequences Through Use of a Histogram of Orientation of Streaks. International Journal of Computer Vision. 93. 348-367. 10.1007/s11263-011-0421-7. (Year: 2011).*
Dennis Hospach, et. al. Simulation of Falling Rain for Robustness Testing of Video-Based Surround Sensing Systems, University of Tuebingen, Faculty of Science, Dept. of Computer Engineering.
SP2—INFRASENS—SP Infrastructure Platform, Safespot Integrated Project—IST-4-026963-IP, Safespot.

* cited by examiner

VIRTUAL SENSOR-DATA-GENERATION SYSTEM AND METHOD SUPPORTING DEVELOPMENT OF VISION-BASED RAIN-DETECTION ALGORITHMS

FIELD OF THE INVENTION

This invention relates to vehicular systems and more particularly to systems and methods for generating training data suitable for use in developing, training, and proving algorithms for using image data to detect rain, other precipitation, or other weather conditions.

BACKGROUND OF THE INVENTION

Rain and other weather conditions can affect the functionality of vehicles. For example, rain can lower traction, enhance glare, impair vision, or the like. Accordingly, what is needed are computer algorithms for detecting and responding to rain and other weather conditions. What is further needed are systems and methods for generating training data suitable for use in developing, training, and proving such algorithms.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
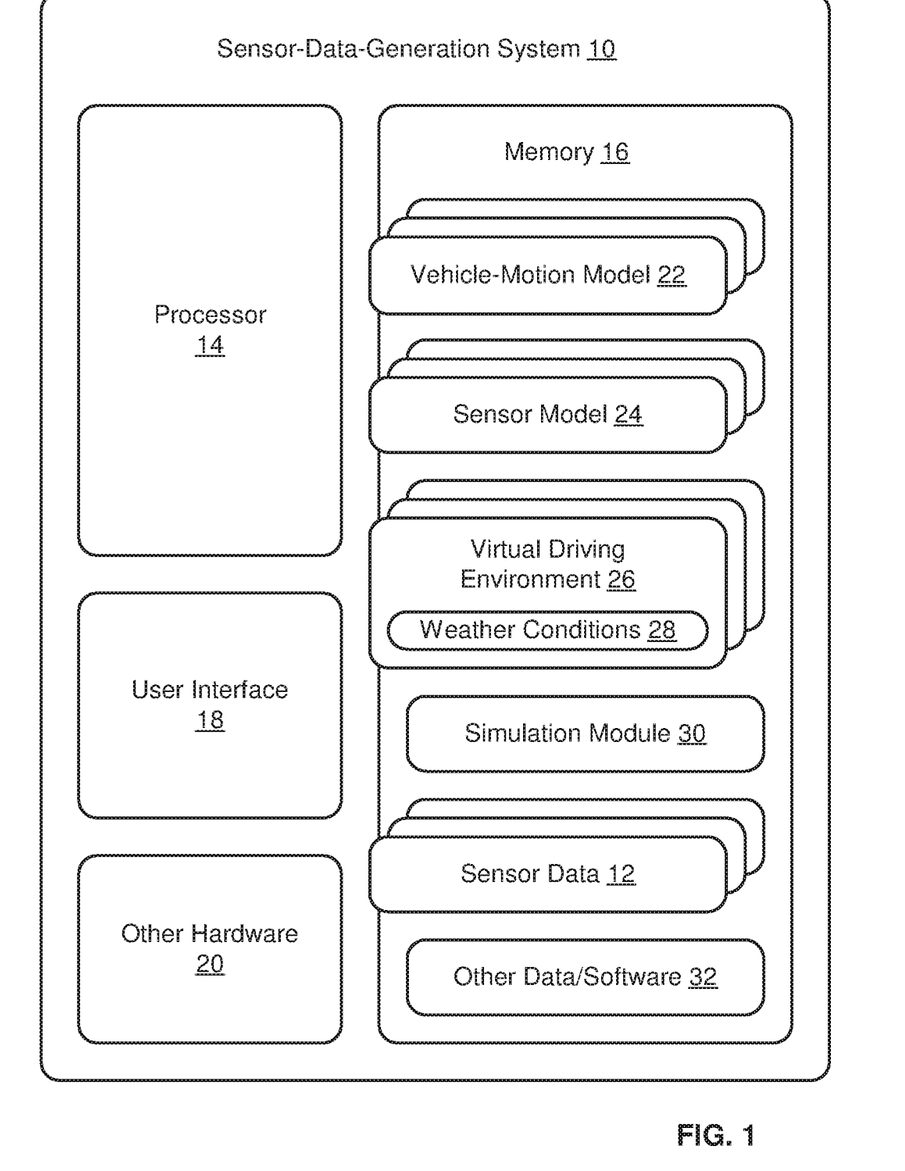
FIG. 1 is a schematic block diagram illustrating one embodiment of a sensor-data-generation system in accordance with the present invention.

Referring to FIG. 1, the real world presents an array of conditions and obstacles that are ever changing. This reality creates significant challenges for vehicle-based systems providing autonomous control of certain vehicle functions, vehicle dynamics, and/or autonomous driving. To overcome these challenges, a vehicle may be equipped with sensors and computer systems that collectively sense, interpret, and appropriately react to a surrounding environment. Key components of such computer systems may be one or more algorithms used to interpret data output by various sensors carried on-board such vehicles.

For example, certain algorithms may analyze one or more streams of sensor data characterizing an area (e.g., road surface) proximate a vehicle and the weather conditions (e.g., type, presence, absence, or amount of precipitation) in that area. Other algorithms may be responsible for deciding what to do based on that data. All such algorithms must be well developed and thoroughly tested. In selected embodiments, an initial and significant portion of such development and testing may be accomplished in a virtual environment. Accordingly, a system 10 in accordance with the present invention may produce sensor data 12 suitable for developing, testing, and/or training various algorithms.

For example, in certain embodiments, a system 10 may execute a simulation in order to produce sensor data 12 suitable for vision-based precipitation detection using deep learning to differentiate between "rain" and "no rain" (or other "weather" or "no weather") classes or conditions. To do this, a system 10 may be embodied as hardware, software, or some combination thereof.

In selected embodiments, a system 10 may include computer hardware and computer software. The computer hardware of a system 10 may include one or more processors 14, memory 16, a user interface 18, other hardware 20, or the like or a combination or sub-combination thereof. The memory 16 may be operably connected to the one or more processors 14 and store the computer software. This may enable the one or more processors 14 to execute the computer software.

A user interface 18 of a system 10 may enable an engineer, technician, or the like to interact with, run, customize, or control various aspects of a system 10. In selected embodiments, a user interface 18 of a system 10 may include one or more keypads, keyboards, touch screens, pointing devices, or the like or a combination or sub-combination thereof.

In selected embodiments, the memory 16 of a computer system 12 may store one or more vehicle-motion models 22, one or more sensor models 24, one or more virtual driving environments 26 (e.g., a virtual environment created using three dimensional modeling and animations tools and containing various virtual weather conditions 28), a simulation module 30, sensor data 12, other data or software 32, or the like or combinations or sub-combinations thereof.

A vehicle-motion model 22 may be a software model that may define for certain situations the motion of the body of a corresponding vehicle. In certain embodiments, such a vehicle motion model 22 may be quite basic. For example, it may simply define a path to take in traversing one or more virtual sensors (e.g., sensors defined by one or more sensor models 24) through a virtual driving environment 26. In other embodiments, a vehicle-motion model 22 may be more robust (e.g., have a higher fidelity to reality). For example, a vehicle-motion model 22 may be provided with one or more driver inputs (e.g., one or more values characterizing things such as velocity, drive torque, brake actuation, steering input, or the like or combinations or subcombinations thereof) and/or information (e.g., data from a virtual driving environment 26) characterizing a road surface. With these inputs and information, a vehicle-motion model 22 may predict motion states of the body of a corresponding vehicle.

The parameters of a vehicle-motion model 22 may be determined or specified in any suitable manner. In selected embodiments, certain parameters of a vehicle-motion model 22 may be derived from previous knowledge of the mechanical properties (e.g., geometries, inertia, stiffness, damping coefficients, etc.) of a corresponding real-world vehicle.

As appreciated, the parameters may be different for different vehicles. Accordingly, in selected embodiments, a vehicle-motion model 22 may be vehicle specific. That is, one vehicle-motion model 22 may be suited to model the body dynamics of a first vehicle (e.g., a particular sports car), while another vehicle-motion model 22 may be suited to model the body dynamics of a second vehicle (e.g., a particular pickup truck).

A sensor model 24 may be a software model that may define or predict for certain situations or "views" the output of a corresponding real-world sensor. In certain embodiments, a sensor model 24 may be provided with information (e.g., data from a virtual driving environment 26) characterizing various views of a road surface or one or more areas proximate thereto, ambient weather conditions, or the like. With this information, a sensor model 24 may produce what an actual sensor would output if presented with those views in the real world.

In selected embodiments, real world sensors of interest may comprise transducers that sense or detect some characteristic of an environment and provide a corresponding output (e.g., an electrical or optical signal) that defines that characteristic. For example, one or more real world sensors of interest may be cameras (e.g., digital cameras). Cameras may be use to produce images of a driving environment. Such images may be analyzed in order to learn something about that driving environment.

A sensor model 24 may model the output produced by any real world sensor of interest. As appreciated, the outputs may be different for different real world sensors. Accordingly, in selected embodiments, a sensor model 24 may be sensor specific. That is, one sensor model 24 may be suited to model the output of a first sensor (e.g., a particular forward-looking digital camera), while another sensor model 24 may be suited to model the output of a second sensor (e.g., a particular rearward-looking digital camera).

A sensor model 24 may produce an output of any suitable format. In selected embodiments, a sensor model 24 may output a signal (e.g., digital signal) that a corresponding real-world sensor would produce. For example, a sensor model 24 corresponding to or modeling a camera may output image data in the form of video or one or more still images defining or forming a plurality of frames.

A simulation module 30 may be programmed to use a virtual driving environment 26, a vehicle-motion model 22, and one or more sensor models 24 to produce an output (e.g., sensor data 12) modeling what would be output by one or more corresponding real world sensors had the one or more real world sensors been mounted to a vehicle (e.g., the vehicle modeled by the vehicle-motion model 22) driven on an actual driving environment like (e.g., substantially or exactly matching) the virtual driving environment 26.

Figure 2:
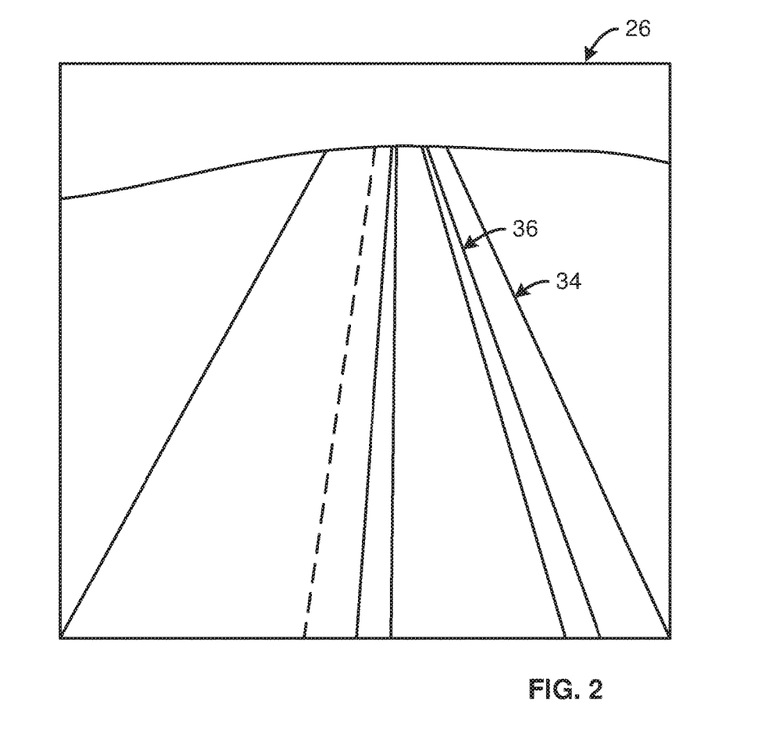
FIG. 2 is a schematic diagram illustrating one embodiment of a virtual driving environment that may include simulated weather conditions in accordance with the present invention.

Referring to FIG. 2, in selected embodiments, a virtual driving environment 26 may comprise a virtual driving surface 34 (e.g., road 34) and various virtual weather conditions 28 positioned at various locations, intensities (e.g., precipitation intensity or amounts of precipitation), or the like with respect to the driving surface 34. The virtual weather conditions 28 in a virtual driving environment 26 may be or include one or more visual features 36 associated with various kinds or degrees of weather in the real world.

For example, certain visual features 36 may be associated with a "rain" condition. Such features 36 may include overcast skies, droplets on an exterior of a window surface (e.g., droplets viewable by a camera located inside a cabin or cab of a vehicle), relative darkness in the surrounding environment considering the time of day, road spray, obscured visibility (e.g., inability to discern or see distant objects), vehicle lights turned on at a time of day when they would not normally be turned on, "shiny" or mirrored road surfaces, tracks that persist for a short period of time after the tires of a vehicle (e.g., the vehicle at issue or one or more other vehicles ahead of the vehicle at issue) have parted the water on a road surface, or the like or any combination or sub-combination thereof. Other visual features may be associated with a "no rain" condition. Such features 36 may include clear skies, an absence of droplets on an exterior of a window surface, normal lighting in the surrounding environment considering the time of day, good visibility (e.g., ability to discern or see distant objects), dull road surfaces, absence of vehicle tracks, or the like or any combination or sub-combination thereof. Other visual features 36 may correspond to other forms of precipitation or other weathers conditions. Accordingly, a virtual driving environment 26 may comprise various visual features 36 positioned at various locations, orientations, or the like with respect to the driving surface 34, other vehicles driving on the driving surface 34, or the like in order to simulate the presence, absence, or degree (i.e., amount) of rain, snow, other precipitation, fog, or the like.

In selected embodiments, a virtual driving environment 26 may include numerous structures that are weather independent such as road surfaces 34 (e.g., single lane, multiple-lane, and/or opposing lane embodiments of various types of construction), hills, flats, road-side configurations, turns, intersections, or the like or combinations thereof with and without other vehicles. In addition thereto, a virtual driving environment 26 may provide, support, or simulate numerous weather conditions 28 based on type, presence, absence, or degree of one or more visual features 36. The number of permutations between numerous weather-independent structures and numerous weather conditions 28 may be significant. Accordingly, a system 10 in accordance with the present invention may produce virtual sensor data 12 in large quantities in a short amount of time. Moreover, relevant parameters such as weather conditions 28 (e.g., precipitation, fog, or the like or an absences thereof), time of day, ambient lighting, relative position and arrangements of the weather-independent structures, and the like may be randomized in the recorded sensor data 12 to ensure a diverse dataset with minimal bias.

Such a diverse dataset may be used to develop and/or train one or more algorithms that properly and repeatably interpret a real world driving environment. When implemented in the real world, those algorithms may lower the adverse effects associated with various weather conditions and in driver or driverless applications. For example, such a dataset may be used develop a classification system that is agnostic to any particular feature contained within the one or more images captured by a camera. That is, a neural network trained on such a dataset may not search an image for any particular feature. Rather, the neural network may judge whether an image in its entirety is more indicative of one class or another.

This agnosticism may provide significant advantages. For example, this type of training may enable each image taken in the real world to be examined or analyzed "as is." That is, there may be no need for image pre-processing for a real world classification system to function properly. Furthermore, no additional calibration may be needed. Moreover, a real world neural network may classify one or more images without regard to whether a camera that captured the one or more images was fixed in an exact location, pointed more toward the sky, pointed more toward the road, pointed forward, pointed reward, or the like.

For example, one or more cameras (e.g., one or more forward-looking cameras, one or more rearward-looking cameras, or a combination thereof) may monitor an area around a real world vehicle. Accordingly, algorithms developed and/or trained using virtual data 12 generated using systems and/or methods in accordance with the present invention may be used to perceive weather (e.g., rain and no rain, snow and no snow, fog and no fog, or the like) conditions and implement appropriate responses or preparations.

Figure 3:
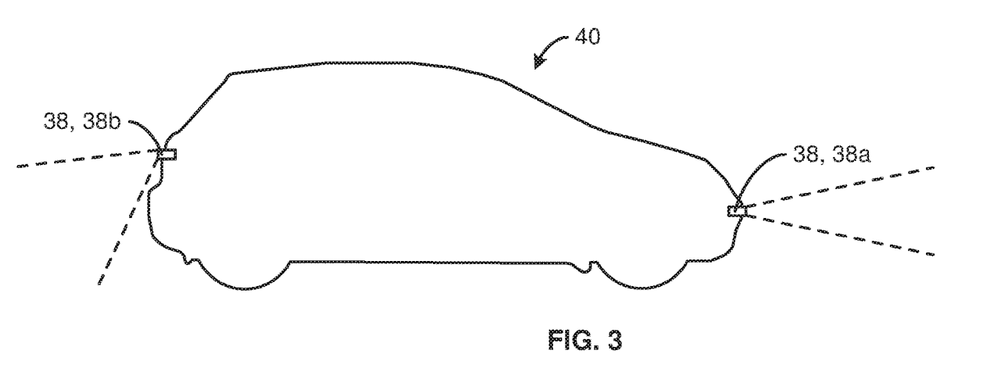
FIG. 3 is a schematic diagram illustrating a virtual vehicle at a first instant in time in which one or more virtual sensors are "viewing" a road surface and/or other conditions of a virtual driving environment.

Referring to FIG. 3, through a series of calculations, a simulation module 30 may effectively traverse one or more virtual cameras 38 (e.g., one or more virtual, forward-looking cameras 38a, one or more virtual, rearward-looking cameras 38b, or a combination thereof) through a virtual driving environment 26 defining or including one or more weather conditions 28. In selected embodiments, this may include manipulating during such a traverse a point of view of certain virtual cameras 38 with respect to the virtual driving environment 26. More specifically, it may include moving during such a traverse one or more virtual cameras 38 with respect to the virtual driving environment 26 as dictated by a vehicle-motion model 22 modeling motion of a corresponding virtual vehicle 40 driving in the virtual driving environment 26 and carrying the one or more virtual cameras 38.

In selected embodiments, to properly account for the motion of the one or more virtual cameras 38, a simulation module 30 may take into consideration three coordinate systems. The first may be a global, inertial coordinate system within a virtual driving environment 26. The second may be an undisturbed coordinate system of a virtual vehicle 40 defined by or corresponding to a vehicle-motion model 22. This may be the coordinate system of an "undisturbed" version of the virtual vehicle 40, which may be defined as having its "xy" plane parallel to a ground plane (e.g., an estimated, virtual ground plane). The third may be a disturbed coordinate system of the vehicle 40. This may be the coordinate system of the virtual vehicle 40 performing roll, pitch, heave, and yaw motions which can be driver-induced (e.g., caused by virtualized steering, braking, accelerating, or the like) and/or road-induced (e.g., caused by a virtual driving environment 26) or due to other virtual disturbances (e.g., weather conditions 28 such as side wind, wheel slippage due to loss of traction, or the like). A simulation module 30 may use two or more of these various coordinate systems to determine which views or conditions pertain to which virtual cameras 38 during a simulation process.

That is, in the real world, the cameras modeled by one or more sensor models 24 may be carried on-board a corresponding vehicle. Certain such cameras may be secured to move with the body of a corresponding vehicle. Accordingly, the view surveyed by such cameras may be change depending on the orientation of the corresponding vehicle with respect to the surrounding environment.

To simulate such effects in a system 10 in accordance with the present invention, a simulation module 30 may take into consideration the location and orientation of one or more virtual cameras 38 (e.g., sensors being modeled by one or more corresponding sensor models 24) within a coordinate system corresponding to the virtual vehicle 40 (e.g., the vehicle being modeled by the vehicle-motion model 22). A simulation module 30 may also take into consideration how such a vehicle-based coordinate system is disturbed in the form of roll, pitch, heave, and yaw motions predicted by a vehicle-motion model 22 based on virtualized driver inputs, road inputs defined by a virtual driving environment 26, and the like. Accordingly, for any simulated moment in time that is of interest, a simulation module 30 may calculate a location and orientation of a particular virtual camera 38 with respect to a virtual driving environment 26 and determine the view within the virtual driving environment 26 to be sensed at that moment by that particular virtual camera 38.

For a first simulated moment in time, a simulation module 30 may determine the views of the virtual driving environment 26 to be sensed at that moment by one or more virtual cameras 38. A simulation module 30 may then obtain from one or more appropriate sensor models 24 outputs that characterize those views. This process may be repeated for a second simulated moment in time, a third simulated moment in time, and so forth. Accordingly, by advancing from one moment in time to the next, a simulation module 30 may obtain one or more data streams respectively modeling what would be the output of the one or more virtual cameras 38 had they and the corresponding virtual driving environment 26 been real.

Figure 4:
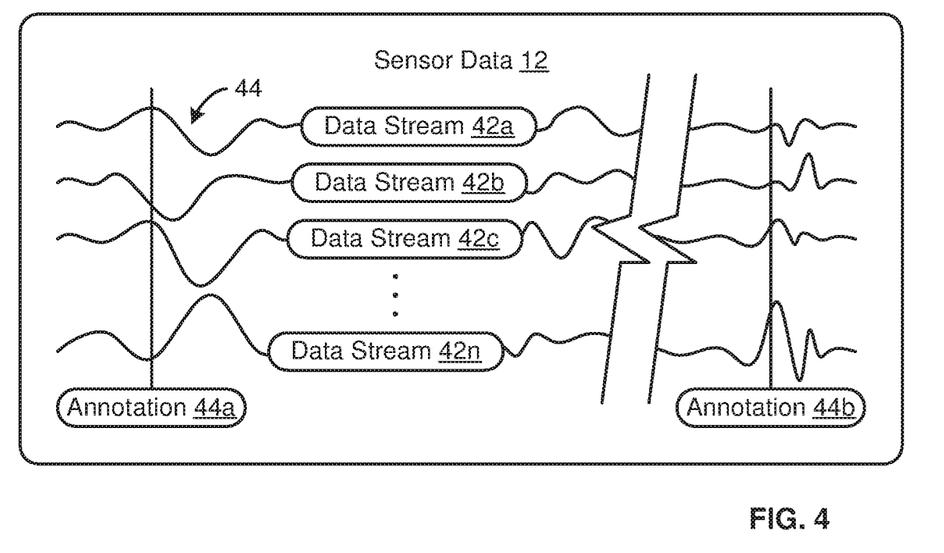
FIG. 4 is a schematic diagram illustrating one embodiment of sensor data tagged with one or more annotations in accordance with the present invention.
Figure 5:
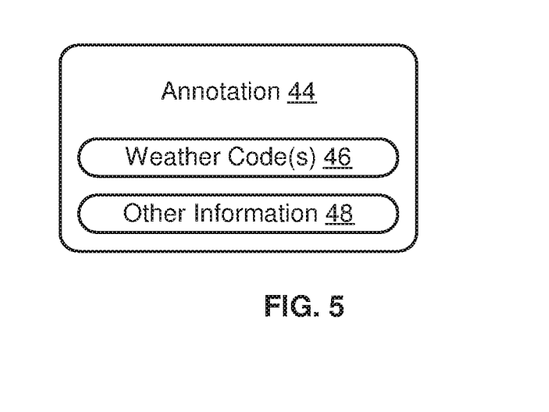
FIG. 5 is a schematic block diagram illustrating one embodiment of an annotation in accordance with the present invention.

Referring to FIGS. 4 and 5, in selected embodiments, different data streams 42 may represent the output of different virtual cameras 38. For example, a first data stream 42a may represent the output of a virtual camera 38a mounted so as to be forward-looking on the front portion of a virtual vehicle 40 and a second data stream 42b may represent the output of a virtual camera 38b mounted so as to be rearward-looking on the rear portion of a virtual vehicle 40. Collectively, the various data streams 42 forming the sensor data 12 for a particular run (e.g., a particular virtual traverse of a particular virtual vehicle 40 through a particular virtual driving environment 26) may represent or account for one or more (e.g., all or less than all) inputs that a particular algorithm (e.g., the vision-based, rain-detection algorithm that is being developed or tested) would use in the real world.

In certain embodiments or situations, a simulation module 30 may couple sensor data 12 with one or more annotations 44. Each such annotation 44 may provide "ground truth" corresponding to the virtual driving environment 26. In selected embodiments, the ground truth contained in one or more annotations 44 may be used to quantify an algorithm's performance in classifying weather conditions in a supervised learning technique.

For example, one or more annotations 44 may include one or more weather codes 46 (e.g., binary values designating rain versus no rain, the presence or absence of one or more other weather conditions 28, or combinations thereof), other information 48, or the like corresponding to various weather conditions 28 encountered by a virtual vehicle 40 in a particular run. Annotations 44 may be linked, tied to, or otherwise associated with particular portions (e.g., one or more frames) of the data streams 42. Accordingly, the ground truth corresponding to a particular weather condition 28 or the like may be linked to the portion of one or more data streams 42 that reflect the perception of one or more virtual cameras 38 of that weather condition 28. In selected embodiments, this may be accomplished by linking different annotations 44a, 44b to different portions of one or more data streams 42.

Figure 6:
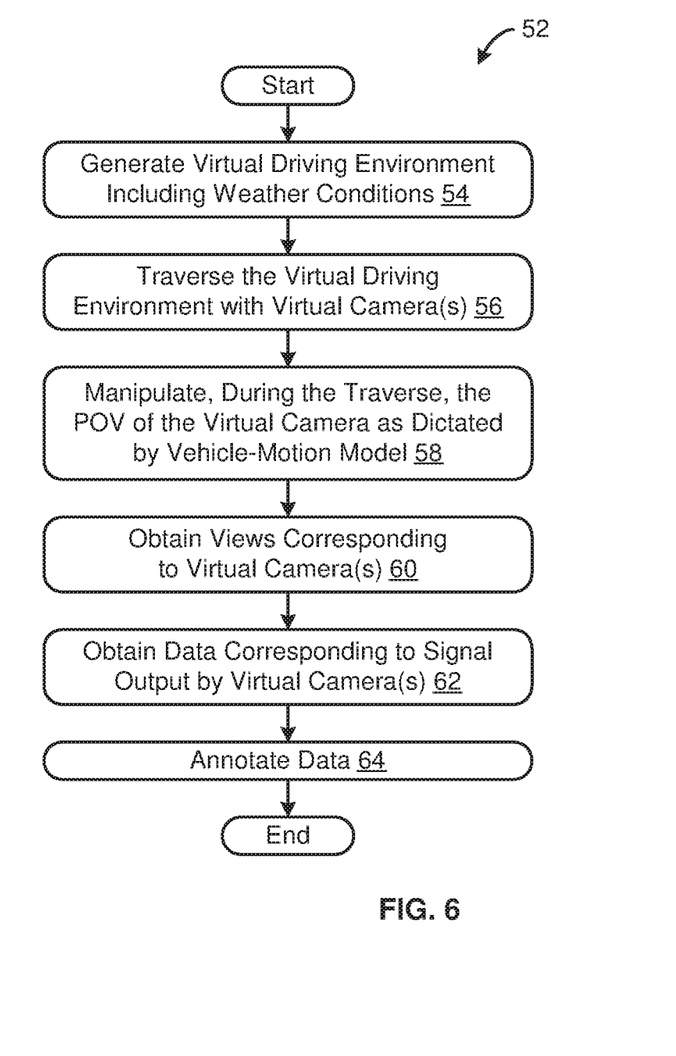
FIG. 6 is a schematic block diagram of one embodiment of a method for generating training data in accordance with the present invention.

Referring to FIG. 6, a system 10 may support, enable, or execute a process 52 in accordance with the present invention. In selected embodiments, such a process 52 may begin with generating 54 a virtual driving environment 26 including various weather conditions 28. The virtual driving environment 26 may then be traversed 56 in a simulation process with one or more virtual cameras 38.

As the virtual driving environment 26 is traversed 56 with one or more virtual cameras 38, the point of view of the one or more virtual cameras 38 with respect to the virtual driving environment 26 may change with each incremental step. In selected embodiments, the point of view of one or more virtual cameras 38 with respect to the virtual driving environment 26 may be manipulated 58 as dictated by a vehicle-motion model 22. Accordingly, the various views to be sensed by the one or more virtual cameras 38 at various simulated moments in time may be obtained 60 or identified 60.

The various views thus obtained 60 or identified 60 may be analyzed by or via corresponding sensor models 24 in order to obtain 62 data 12 reflecting what a corresponding real world digital camera viewing the various views in the real world would have produced or output. In selected embodiments, this data 12 may be annotated 64 with ground truth information to support or enable certain supervised learning techniques.

Thus, one or more virtual cameras 38 may be positioned relative to a virtual roadway 34 according to their planned positioning on a real world vehicle. The virtual cameras 38 may then be moved along the virtual roadway 34 into locations where they can observe one or more weather conditions 28. The one or more virtual cameras 38 may then produce data 42 as they move through the virtual environment 26.

For each time step of produced data 42, annotations 44 may be automatically provided to record ground truth information about the weather conditions. For example, each frame (e.g., discrete image) of produced data 42 may have a corresponding entry in a log file that sets forth or identifies the ground truth of whether a rain condition (or some other precipitation or weather condition) is present (e.g., has been captured) in that frame.

Once generated, sensor data 12 in accordance with the present invention may be used to train or test various algorithms. In certain embodiments, the ground truth information forming part of the sensor data 12 may be used to train one or more algorithms (e.g., one or more perception algorithms) using supervised learning or to test an existing algorithm and quantify its performance.

For example, the sensor data 12 may be used to train or test one or more algorithms used by vehicular systems to prepare for or lower the adverse effects associated with various weather conditions in the real world. Accordingly, the sensor data 12 may be used to train (or test the ability of) one or more algorithms to perceive rain, snow, fog, or other weather conditions, implement weather-appropriate responses or preparations when such conditions are perceived, or the like or combinations or sub-combinations thereof.

The flowchart in FIG. 6 illustrates the architecture, functionality, and operation of a possible implementation of a system, method, and computer program product according to one embodiment of the present invention. In this regard, each block in the flowchart may represent a module, segment, or portion of code, which comprises one or more executable instructions for implementing the specified logical function(s). It will also be noted that each block of the flowchart illustration, and combinations of blocks in the flowchart illustration, may be implemented by special purpose hardware-based systems that perform the specified functions or acts, or combinations of special purpose hardware and computer instructions.

It should also be noted that, in some alternative implementations, the functions noted in the blocks may occur out of the order noted in the Figure. In certain embodiments, two blocks shown in succession may, in fact, be executed substantially concurrently, or the blocks may sometimes be executed in the reverse order, depending upon the functionality involved. Alternatively, certain steps or functions may be omitted if not needed.

In the above disclosure, reference has been made to the accompanying drawings, which form a part hereof, and in which is shown by way of illustration specific implementations in which the disclosure may be practiced. It is understood that other implementations may be utilized and structural changes may be made without departing from the scope of the present disclosure. References in the specification to "one embodiment," "an embodiment," "an example embodiment," "selected embodiments," "certain embodiments," etc., indicate that the embodiment or embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Implementations of the systems, devices, and methods disclosed herein may comprise or utilize a special purpose or general-purpose computer including computer hardware, such as, for example, one or more processors and system memory, as discussed herein. Implementations within the scope of the present disclosure may also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, implementations of the disclosure can comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links, which can be used to carry desired program code means in the form of computer-executable instructions or data structures and which can be accessed by a general purpose or special purpose computer. Combinations of the above should also be included within the scope of computer-readable media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, an in-dash vehicle computer, personal computers, desktop computers, laptop computers, message processors, handheld devices, multi-processor systems, microprocessor-based or programmable consumer electronics, network PCs, minicomputers, mainframe computers, mobile telephones, PDAs, tablets, pagers, routers, switches, various storage devices, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Further, where appropriate, functions described herein can be performed in one or more of: hardware, software, firmware, digital components, or analog components. For example, one or more application specific integrated circuits (ASICs) can be programmed to carry out one or more of the systems and procedures described herein. Certain terms are used throughout the description and claims to refer to particular system components. As one skilled in the art will appreciate, components may be referred to by different names. This document does not intend to distinguish between components that differ in name, but not function.

It should be noted that the sensor embodiments discussed above may comprise computer hardware, software, firmware, or any combination thereof to perform at least a portion of their functions. For example, a sensor may include computer code configured to be executed in one or more processors, and may include hardware logic/electrical circuitry controlled by the computer code. These example devices are provided herein purposes of illustration, and are not intended to be limiting. Embodiments of the present disclosure may be implemented in further types of devices, as would be known to persons skilled in the relevant art(s).

At least some embodiments of the disclosure have been directed to computer program products comprising such logic (e.g., in the form of software) stored on any computer useable medium. Such software, when executed in one or more data processing devices, causes a device to operate as described herein.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments, but should be defined only in accordance with the following claims and their equivalents. The foregoing description has been presented for the purposes of illustration and description. It is not intended to be exhaustive or to limit the disclosure to the precise form disclosed. Many modifications and variations are possible in light of the above teaching. Further, it should be noted that any or all of the aforementioned alternate implementations may be used in any combination desired to form additional hybrid implementations of the disclosure.

What is claimed is:

1. A method for generating a plurality of electronically annotated digital image files suitable for use as training data in a machine learning process, the method comprising:
   traversing, by a computer system, one or more virtual cameras over a virtual road surface in a simulation;
   recording, by the computer system, a plurality of electronic digital image files corresponding to signals output by the one or more virtual cameras during the traversing; and
   converting, by the computer system, the plurality of electronic digital image files to training data by electronically annotating each electronic digital image file thereof with ground-truth data indicating whether virtual precipitation from the simulation is encoded therewithin.

2. The method of claim 1, wherein the annotating comprises annotating each electronic digital image file of the plurality of electronic digital image files with ground-truth data indicating whether virtual rain from the simulation is encoded therewithin.

3. The method of claim 2, wherein the traversing comprises moving each of the one or more virtual cameras with respect to the virtual road surface as dictated by a vehicle-motion model modeling motion of a vehicle carrying the one or more virtual cameras and driving on the virtual road surface.

4. The method of claim 3, wherein the traversing comprises traversing in the simulation the one or more virtual cameras over the virtual road surface and through at least one virtual rain condition and at least one virtual no rain condition.

5. The method of claim 4, further comprising using the training data to train an artificial neural network to distinguish between photographic data corresponding to the rain condition and photographic data corresponding to the no rain condition.

6. The method of claim 5, wherein the one or more virtual cameras comprise a forward-looking camera positioned to sense a portion of the virtual road surface ahead of the vehicle.

7. The method of claim 5, wherein the one or more virtual cameras comprise a rearward-looking camera positioned to sense a portion of the virtual road surface behind the vehicle.

8. The method of claim 1, wherein the traversing comprises moving each of the one or more virtual cameras with respect to the virtual road surface as dictated by a vehicle-motion model modeling motion of a vehicle carrying the one or more virtual cameras and driving on the virtual road surface.

9. The method of claim 8, wherein the one or more virtual cameras comprise a forward-looking camera positioned to sense a portion of the virtual road surface ahead of the vehicle.

10. The method of claim 8, wherein the one or more virtual cameras comprise a rearward-looking camera positioned to sense a portion of the virtual road surface behind the vehicle.

11. The method of claim 1, further comprising using the training data to train an artificial neural network to distinguish between photographic data corresponding to a precipitation condition and photographic data corresponding to the no precipitation condition.

12. A method for generating a plurality of electronically annotated digital image files suitable for use as training data in a machine learning process, the method comprising:
   executing, by a computer system, a simulation comprising
      traversing one or more virtual cameras over a virtual road surface and through at least one virtual precipitation condition and at least one virtual no precipitation condition that are sensible by the one or more virtual cameras, and
      moving, during the traversing, each of the one or more virtual cameras with respect to the virtual road surface as dictated by a vehicle-motion model modeling motion of a vehicle driving on the virtual road surface while carrying the one or more virtual cameras;
   recording, by the computer system, a plurality of electronic digital image files characterizing the at least one virtual precipitation condition and at least one virtual no precipitation condition, the plurality of electronic digital image files corresponding to signal output by the one or more virtual cameras during the traversing; and
   converting, by the computer system, the plurality of electronic digital image files to training data by electronically annotating each electronic digital image file thereof with ground-truth data indicating whether the virtual precipitation or the virtual no precipitation condition is encoded therewithin.

13. The method of claim 12, further comprising using the training data to train an artificial neural network to distinguish between photographic data corresponding to a rain condition and photographic data corresponding to the no rain condition.

14. The method of claim 12, wherein the one or more virtual cameras comprise a forward-looking camera positioned to sense a portion of the virtual road surface ahead of the vehicle.

15. The method of claim 12, wherein the one or more virtual cameras comprise a rearward-looking camera positioned to sense a portion of the virtual road surface behind the vehicle.

16. A computer system comprising:
   one or more processors;
   memory operably connected to the one or more processors; and
   the memory storing
      a virtual driving environment programmed to include at least one virtual precipitation condition and at least one virtual no precipitation condition,
      a first software model programmed to model a digital camera,
      a second software model programmed to model a vehicle,
      a simulation module programmed to use the virtual driving environment, the first software model, and the second software model to produce an a plurality of electronic digital image files modeling what would be output by the digital camera had the digital camera been mounted to the vehicle and the vehicle had driven on an actual driving environment matching the virtual driving environment, and
      the simulation module further programmed to electronically annotate each electronic digital image file of the plurality of electronic digital image files with ground-truth data indicating whether the at least one virtual precipitation condition or the at least one virtual no precipitation condition is encoded therewithin.

17. The system of claim 16, wherein the digital camera comprises a forward-looking camera positioned to sense a portion of the virtual driving environment ahead of the vehicle.

18. The system of claim 16, wherein the digital camera comprises a rearward-looking camera positioned to sense a portion of the virtual driving environment behind the vehicle.

* * * * *